United States Patent
Cho

[11] Patent Number: 5,973,484
[45] Date of Patent: Oct. 26, 1999

[54] VOLTAGE REGULATOR CIRCUIT FOR SEMICONDUCTOR MEMORY DEVICE

[75] Inventor: Jin-Hee Cho, Cheongju, Rep. of Korea

[73] Assignee: LG Semicon Co., Ltd., Choongcheongbuk-Do, Rep. of Korea

[21] Appl. No.: 09/073,862

[22] Filed: May 7, 1998

[30] Foreign Application Priority Data

May 7, 1997 [KR] Rep. of Korea ................. 97-17389

[51] Int. Cl.⁶ .................... G05F 1/40; G05F 3/16
[52] U.S. Cl. ................ 323/269; 323/314; 323/315
[58] Field of Search .................. 323/269, 312, 323/313, 314, 349, 315; 365/226, 207

[56] References Cited

U.S. PATENT DOCUMENTS 5,463,588  10/1995  Chonan ..................... 365/226
5,844,404  12/1998  Caser et al. ................ 323/314

Primary Examiner—Peter S. Wong
Assistant Examiner—Rajnikant D. Patel

[57] ABSTRACT

A voltage regulator circuit for a semiconductor memory device includes a first internal source voltage generator for receiving a reference voltage and a column address strobe signal and for supplying an internal source voltage based on an external source voltage, and a second internal source voltage generator for receiving the reference voltage and a row address strobe signal and for supplementing the supply of the internal source voltage based on the external source voltage. The circuit separately controls the operation of the voltage regulator circuit in accordance with an operational condition of a semiconductor memory device to generate an internal power source having stable voltage, while decreasing stand-by current.

23 Claims, 2 Drawing Sheets

VOLTAGE REGULATOR CIRCUIT FOR SEMICONDUCTOR MEMORY DEVICE

BACKGROUND OF THE INVENTION

1. Field of the Invention

The present invention relates to a voltage regulator circuit for generating a supply voltage adopted in a semiconductor memory device, and more particularly to an improved voltage regulator circuit for a semiconductor memory device capable of separately controlling the operation of a voltage regulator circuit in accordance with an operational condition of a semiconductor memory device to generate an internal power source having stable voltage, while decreasing a stand-by current.

2. Description of the Prior Art

FIG. 1 illustrates a conventional voltage regulator circuit for a semiconductor memory device. The conventional voltage regulator circuit includes a first internal source voltage generator 1 for receiving a reference voltage Vref and for converting an external source voltage VCC to an internal source voltage VDD; and a second internal source voltage generator 2 for receiving the reference voltage Vref and a row address strobe signal RAS and for converting an external source voltage VCC to an internal source voltage VDD.

The external source voltage VCC denotes a source voltage being applied from an exterior of a semiconductor memory device, and the internal source voltage VDD denotes a source voltage being supplied to the semiconductor memory device by the voltage regulator circuit.

With reference to FIG. 2 detailing FIG. 1, the first internal source voltage generator 1 includes a first differential amplifier D1 for comparing the reference voltage Vref and the internal source voltage VDD, and a first PMOS transistor P1, the gate of which receives an output signal Es from the first differential amplifier D1, the source of which is connected to the external source voltage VCC, and the drain of which is connected to the internal source voltage VDD. The first differential amplifier D1 is connected to current source Istb.

The second internal source voltage generator 2 includes a second differential amplifier D2 for comparing the reference voltage Vref and the internal source voltage VDD, and a second PMOS transistor P2, the gate of which receives an output signal Ea of the second differential amplifier D2, the source of which is connected to the external source voltage VCC, and the drain of which is connected to the internal source voltage VDD. The second differential amplifier D2 is connected to current source Iact which is controlled by the row address strobe signal RAS.

The operation of the above-described conventional voltage regulator device will now be separately described with reference to a stand-by state and an active state which are related to the logic level of the row address strobe RAS.

When the row address strobe RAS has a low level (i.e., stand-by state), the source current Iact of the second internal source voltage generator 2 is turned off, causing the second differential amplifier D2 to become inactivated so that the second internal source voltage generator 2 is not driven. To the contrary, the first internal source voltage generator 1 is constantly driven by a source current Istb (not shown). That is, in a stand-by state, only the first internal source voltage generator 1 is operated.

In the stand-by state, when the internal source voltage VDD being applied through a non-inverting terminal of the first differential amplifier D1 in the first internal source voltage generator 1 is higher than the reference voltage Vref being applied through an inverting terminal of the first differential amplifier D1, the output voltage Es of the first differential amplifier D1 becomes heightened, and a gate-source voltage Vgs of the first PMOS transistor P1 becomes lowered. Therefore, the driving capacity of the first PMOS transistor P1 becomes deteriorated, thereby lowering the internal source voltage VDD. Also, when the internal source voltage VDD is lower than the reference voltage Vref, the output voltage Es of the first differential amplifier D1 becomes lower, causing the gate-source voltage Vgs of the first PMOS transistor P1 to increase consequently, the driving capability of the first PMOS transistor P1 and the external source voltage VDD are increased.

With repetition of such operation, the internal source voltage VDD becomes identical to the reference voltage Vref.

Accordingly, an active state denotes a state in which the second internal source generator 2 and the first internal source voltage generator 1 are concurrently operated. When the row address strobe RAS has a high level, the source current Iact of the second internal source voltage generator 2 is turned on and the second differential amplifier D2 is operated, causing the second internal source generator 2 to be operated.

In the active state, the operation of the first internal source voltage generator 1 becomes identical to that of the stand-by state, and the operation of the second internal source voltage generator 2 will now be described.

When internal source voltage VDD being applied to a non-inverting terminal of the second differential amplifier 2 in the second internal source voltage generator 2 is higher than the reference voltage Vref being applied to an inverting terminal of the second differential amplifier D2, the output voltage Ea of the second differential amplifier D2 becomes lower, causing the gate-source voltage Vgs of the second PMOS transistor P2 to become lower. Therefore, the driving capacity of the second PMOS transistor P2 becomes deteriorated, thereby lowering the internal source voltage VDD.

To the contrary, when the internal source voltage VDD is lower than the reference voltage Vref, the output voltage Ea of the second differential amplifier D2 decreases causing the gate-source voltage Vgs of the second PMOS transistor P2 to decrease. Consequently, the driving capacity of the second PMOS transistor P2 and the internal source voltage VDD increases.

With the repetition of the above-described operation, the second internal source voltage generator 2 causes the internal source voltage VDD to become identical to the reference voltage Vref during the active state.

The source current Istb of the first differential amplifier D1 is determined by considering characteristics of the first differential amplifier D1, such as driving capacity, response speed, and stand-by current. When a magnitude of the source current Istb is substantially small, the stand-by current is attenuated, and the driving capacity and response spaced of the first differential amplifier D1 become deteriorated. To the contrary, when the source current Istb is sufficiently large, the stand-by current becomes increased and the driving capacity and the response speed of the first differential amplifier D1.

However, in the above-described conventional voltage regulator circuit for a semiconductor memory device, a column address strobe signal CAS (not show) maintains a high level when the row address strobe signal RAS has a low level corresponding to a stand-by state. Because the column address strobe signal CAS is applied to the semiconductor memory device, temporal current consumption occurs in the semiconductor memory device, effectively deteriorating the internal source voltage VDD. Once the first differential amplifier D1 is operated, if data is accessed before the internal source voltage VDD becomes identical to the reference voltage Vref, an erroneous system operation may occur.

Conventionally, in order to solve such disadvantages, the internal source voltage VDD had to be adjusted to a level that is identical to the reference voltage Vref, by using a method of increasing the magnitude of the source current Istb and improving the response speed of the first differential amplifier D1. However, there is witnessed a disadvantage in that when the source current Istb is increased, the stand-by current of the memory device becomes increased.

SUMMARY OF THE INVENTION

It is an object of the present invention to provide a voltage regulator circuit for a semiconductor memory device, wherein a source current being operated by a column address strobe (CAS) signal is connected in parallel to the source current Istb and additionally to the first differential amplifier D1, so that when an internal source voltage VDD is decreased in accordance with the column address strobe signal, the response speed of the first differential amplifier becomes faster and the internal source voltage VDD quickly becomes identical to the reference voltage Vref, thereby preventing an erroneous system operation from occurring when data is accessed.

To achieve the above-described object, there is provided a voltage regulator circuit for a semiconductor memory device according to the present invention which includes a first internal source voltage generator for receiving a reference voltage and a column address strobe signal and for supplying an internal source voltage based on an external source voltage, and a second internal source voltage generator for receiving the reference voltage and a row address strobe signal and for supplementing the supply the the internal source voltage based on the external source voltage.

Additionally, there is provided a voltage regulator circuit for a semiconductor memory device including a first differential amplifier and a first switch. The first differential amplifier is supplied with a reference voltage and an internal voltage signal, and connected in parallel to first and second power supplies power from the second power supply being regulated based on a level of a column address strobe signal. The first switch is connected to an external voltage source. The first switch is switched in accordance with an output value generated by the first differential amplifier to supply the internal voltage signal, which is based on the voltage of the external voltage source. The voltage reguraltor circuit may further include a second differential amplifier and a second switch. The second differential amplifier is supplied with the reference voltage and the internal voltage signal, and connected to a third power supply. Power from the third power supply is regulated based on a level of a row address strobe signal. The second switch is connected to the external voltage source, and switched in accordance with an output value generated by the second differential amplifier to supplement the supply of the internal voltage signal. The second switching transistor supplements the supply of the internal source voltage when power is supplied from the third power supply. The first and second switches are switching transistors, supplying the internal voltage signal in an active state. The first switch alone supplies the internal voltage signal in a stand-by state. The column address signal regulates the second power supply to supply power in the stand-by state. The row address strobe signal has a high level in the active state, and the row address strobe signal has a low level in the stand-by state. The column address strobe signal has a high level in the active state, and the column address strobe signal has a low level in the stand-by state.

Further scope of applicability of the present invention will become apparent from the detailed description given hereinafter. However, it should be understood that the detailed description and specific examples, wile indicating preferred embodiments of the invention, are given by way of example only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
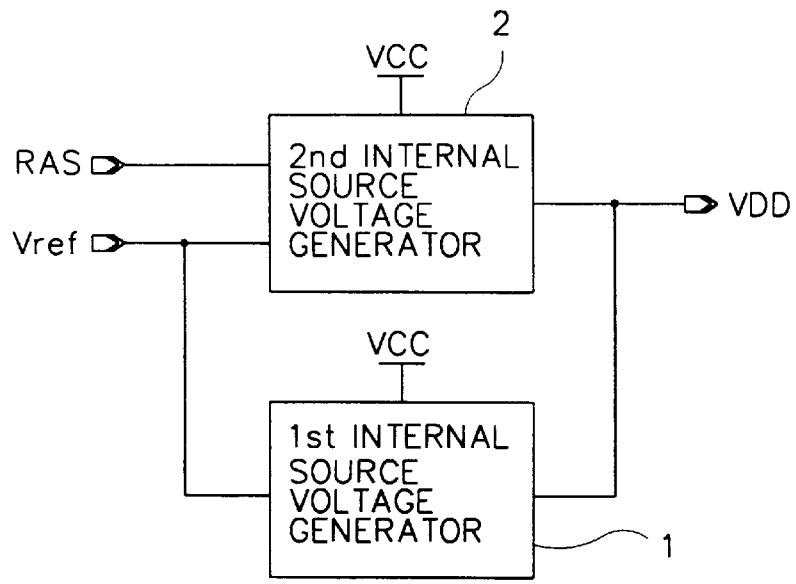
FIG. 1 is a block diagram illustrating a voltage regulator circuit for a semiconductor memory device according to a conventional art.
Figure 2:
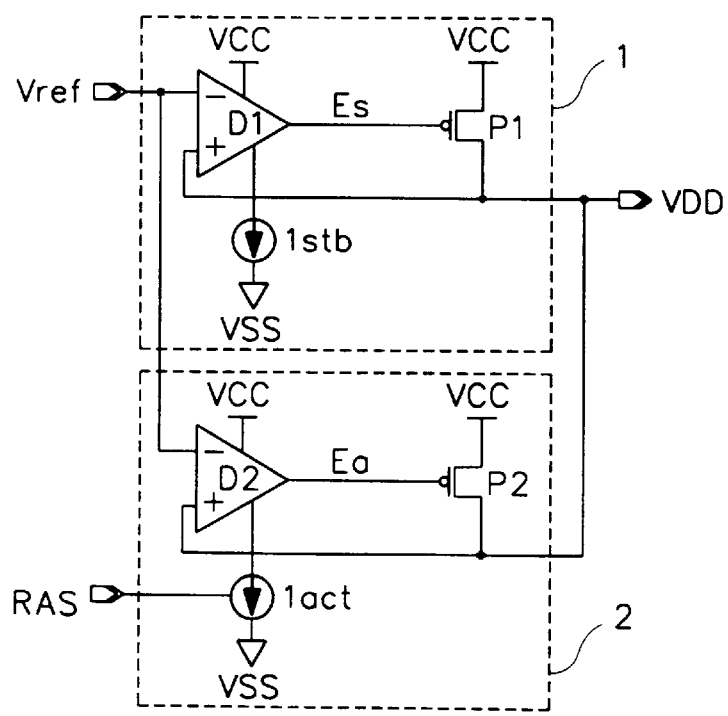
FIG. 2 is a detailed circuit view of FIG. 1.
Figure 3:
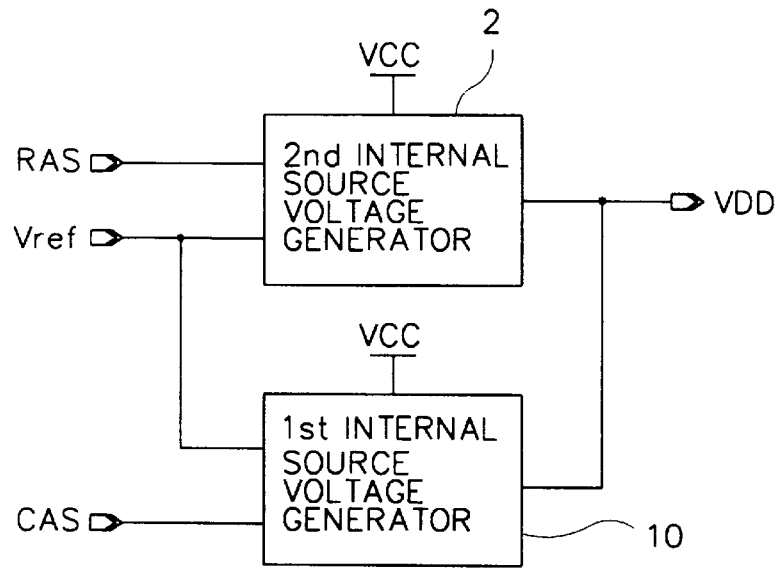
FIG. 3 is a block diagram illustrating a voltage regulator circuit for a semiconductor memory device according to the present invention.

As shown in FIG. 3 illustrating a voltage regulator circuit for a semiconductor memory device according to the present invention, the regulator circuit includes: a first internal source voltage generator 10 for receiving a reference voltage Vref and a column address strobe signal CAS, and for supplying an internal source voltage VDD based on an external source voltage VCC; and a second internal source voltage generator 2 for receiving the reference voltage Vref and a row address strobe signal RAS and for supplementing the supply of the internal source voltage VDD based on the external source voltage VCC.

Figure 4:
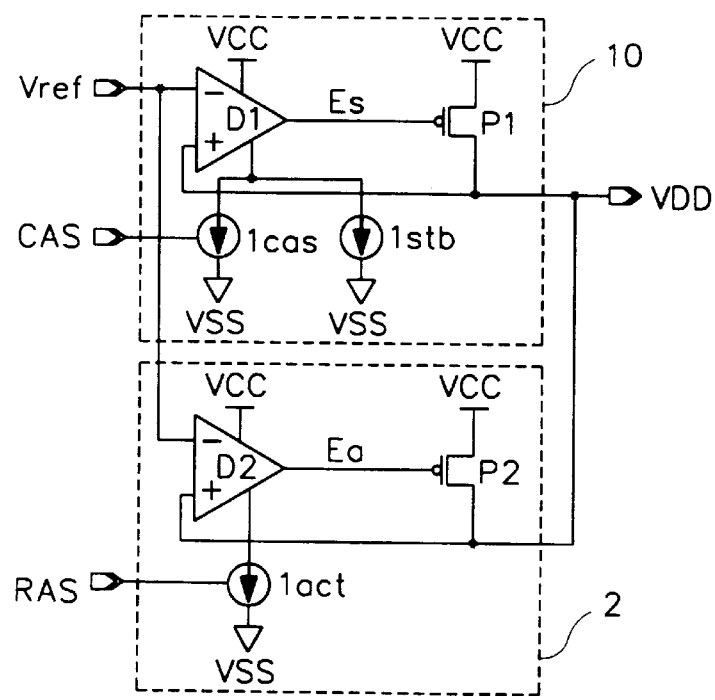
FIG. 4 is a detailed circuit view of FIG. 3.

With reference to FIG. 4 detailing FIG. 3, the first internal source voltage generator 10 includes a first differential amplifier D1 for comparing the reference voltage Vref and the internal source voltage VDD, and a first PMOS transistor P1, the gate of which receives an output signal Es of the first differential amplifier D1, the source of which is connected to the external source voltage VCC, and the drain of which is connected to the internal source voltage VDD. The first differential amplifier D1 is connected to current source Istb and the current source Icas, which is controlled by a column address strobe signal CAS and which is connected in parallel to the source current Istb.

The second internal source voltage generator 2 includes a second differential amplifier D2 for comparing the reference voltage Vref and the internal source voltage VDD, and a second PMOS transistor 12, the gate of which receives an output signal Ea of the second differential amplifier D2, the source of which is connected to the external source voltage VCC, and the drain of which is connected to the internal source voltage VDD. The second differential amplifier D2 is connected to current source Iact which is controlled by the row address strobe signal RAS.

The operation of the thusly constituted voltage regulator device for a semiconductor memory device according to the present invention will now be described.

First, when the row address strobe signal RAS has a high level (i.e., an active state), the column address strobe signal CAS has a low level, causing the operation of the present invention in the active state to become identical to that of the conventional voltage regulator circuit.

However, when the row address strobe signal RAS has a low level, the current source Icas varies between a pair of states depending on a logic state of the column address strobe signal CAS, distinguishing its operation from that of conventional voltage regulator circuits. A column address strobe signal CAS having a low level is referred to as a low stand-by state of a column address strobe signal, and the column address strobe signal CAS having a high level is referred to as a high stand-by state of a column address strobe signal.

In the low stand-by state of the column address strobe signal CAS, the source current Icas is turned off in accordance with a low level column address strobe signal CAS, and the source Iact is turned off in accordance with a low level row address strobe signal RAS so that the second internal source voltage generator 2 is not driven. Consequently, the first differential amplifier D1 of the first internal source voltage generator 10 is operated only by the source current Istb. Therefore, the operation of the present invention in a low stand-by state of the column address strobe signal CAS becomes identical to that of the conventional voltage regulator circuit in the stand-by state.

Meanwhile, in the high stand-by state of the column address strobe signal CAS, the source current Icas is turned on in accordance with the high level column address strobe signal CAS, and the second internal source voltage generator 2 is not driven due to a low level row address strobe signal RAS. Therefore the first differential amplifier D1 of the first internal source voltage generator 10 is operated by a pair of source currents, that is to say, by a source current Icas that is turned on in accordance with the column address strobe signal CAS and a source current Istb that is constantly turned on, so that the applied reference voltage Vref and the internal source voltage VDD are compared with each other to generate an output signal Es, and the driving capacity of the first PMOS transistor P1 is determined by the output voltage Es.

Here, as described above with regard to the disadvantage of the conventional art, the internal source voltage VDD is temporarily lowered due to the high level column address strobe signal CAS. However, the driving capacity of the first differential amplifier D1 is raised in accordance with the high level column address strobe signal CAS, so that the internal source voltage VDD being lowered is quickly raised to a level of the reference voltage.

As described above, although the internal source voltage is lowered resulting from a state in which the column address strobe signal CAS remains in a high level, the driving capacity of the differential amplifier is increased in accordance with a high level column address strobe signal CAS, Thus, the voltage regulator circuit for a semiconductor memory device according to the present invention enables a lowered internal source voltage to quickly rise to the level of the reference voltage, thereby preventing an erroneous system operation from occurring during a data access.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefor, it is intended that the present invention not be limited to the particular embodiment disclosed as the best mode contemplated for carrying out the present invention, but that the present invention includes all embodiments falling within the scope of the appended claims.

The foregoing description and the drawings are regarded as including a variety of individually inventive concepts, some of which may lie partially or wholly outside the scope of some or all of the following claims. The fact that the applicant has chosen at the time of filing of the present application to restrict the claimed scope of protection in accordance with the following claims is not to be taken as a disclaimer or alternative inventive concepts that are included in the contents of the application and could be defined by claims differing in scope from the following claims, which different claims may be adopted subsequently during prosecution, for example, for the purposes of a continuation or divisional application.

What is claimed is:

1. A voltage regulator circuit for a semiconductor memory device, comprising:

a first internal source voltage generator for receiving a reference voltage and a first address strobe signal, and for supplying an internal source voltage based on an external source voltage; and a second internal source voltage generator for receiving the reference voltage and a second address strobe signal, and for supplementing the supply of the internal source voltage based on the external source voltage, wherein the first and second internal source voltage generators include power supplies that increase power supplied to the first internal source voltage generator when the second internal source voltage generator is operating at less than full capacity.

2. The circuit recited by claim 1, wherein the internal source voltage is connected to a node which communicates in common to each output terminal of the first and second internal source voltage generators.

3. The circuit recited by claim 1, wherein the first and second internal source voltage generators are operated when the row address strobe signal has a high level, and only the first internal source voltage generator is operated when the row address strobe signal has a low level.

4. The circuit recited by claim 1, wherein the first internal source voltage generator comprises:

a differential amplifier for receiving the reference voltage and the internal source voltage;

a switching transistor being switched in accordance with an output value of the differential amplifier and outputting the internal source voltage; and a current source for driving the differential amplifier.

5. The circuit recited by claim 4, wherein the switching transistor is a PMOS transistor having a source and a drain, the source being connected to an external source voltage, and the drain being connected to the internal source voltage.

6. The circuit recited by claim 4, wherein the current source comprises:

a first current source which is controlled by the column address strobe signal; and a second current source which is connected in parallel to the first current source.

7. The circuit recited by claim 6, wherein the first source current is turned on when the column address strobe signal has a high level.

8. The circuit recited by claim 1, wherein the second internal source voltage generator comprises:
- a differential amplifier for receiving the reference voltage and the internal source voltage;
- a switching transistor being switched in accordance with ail output value of the differential amplifier and outputting the internal source voltage; and
- a source current supply for driving the differential amplifier.

9. The circuit recited by claim 8, wherein the switching transistor is a PMOS transistor having a source and a drain, the source being connected to an external source voltage, and the drain being connected to the internal source voltage.

10. The circuit recited by claim 8, wherein the source current supply is controlled by the row address strobe signal.

11. A voltage regulator circuit for a semiconductor memory device, comprising:
- a first differential amplifier to which a reference voltage and an internal voltage signal are supplied, and to which first and second power supplies are connected in parallel, power from the second power supply being regulated based on a level of a first address strobe signal; and
- a first switch connected to an external voltage source, the first switch being switched in accordance with an output value generated by the first differential amplifier to supply the internal voltage signal, the internal voltage signal being based on the voltage of the external voltage source,
- where one of the first and second power supplies supplies increased power to the first differential amplifier while the voltage regulator circuit is in a stand-by state.

12. The voltage regulator circuit recited by claim 11, further comprising:
- a second differential amplifier to which the reference voltage and the internal voltage signal are supplied, and to which a third power supply is connected, power from the third power supply being regulated based on a level of a second address strobe signal; and
- a second switch connected to the external voltage source, the second switch being switched in accordance with an output value generated by the second differential amplifier to supplement the supply of the internal voltage signal, the second switching transistor supplementing the supply of the internal source voltage when power is supplied from the third power supply,
- where the second switch prevents supplementation of the supply of the internal voltage signal by the output from the second differential amplifier during the stand-by state.

13. The voltage regulator circuit recited by claim 12, wherein the first and second switches are switching transistors.

14. The voltage regulator circuit recited by claim 12, wherein the first and second switches supply the internal voltage signal in an active state, and only the first switch supplies the internal voltage signal in a stand-by state.

15. The voltage regulator circuit recited by claim 14, wherein the first address signal regulates the second power supply to supply power in the stand-by state.

16. The voltage regulator circuit recited by claim 14, wherein the second address strobe signal has a high level in the active state, and the second address strobe signal has a low level in the stand-by state.

17. The voltage regulator circuit recited by claim 16, wherein the first address strobe signal has a high level in the active state, and the second address strobe signal has a low level in the stand-by state.

18. The circuit of claim 1, wherein the increased power is supplied to the first internal source voltage generator based on a level of the first address strobe signal.

19. The circuit of claim 12, wherein the increased power is supplied by one of the first and second power supplies based on a level of the first address strobe signal.

20. A voltage regulator circuit, comprising:
- a first voltage generator that generates a source voltage based on an input reference voltage; and
- a second voltage generator that supplements the source voltage based on the input reference voltage,
- wherein the first voltage generator includes a power supply capable of increasing power to the first voltage generator when the second voltage generator is operating at less than full capacity.

21. The voltage regulator circuit of claim 20, wherein the second voltage generator is operated at less than full capacity in a stand-by mode.

22. The voltage regulator circuit of claim 20, wherein the second voltage generator includes a second power supply, the power supplied by the first power supply being increased when the power supplied to the second voltage generator by the second power supply being decreased.

23. The voltage regulator circuit of claim 22, wherein the power supplied by the first power supply is controlled based on a level of a column address strobe signal.

* * * * *